United States Patent [19]
Deckert et al.

[11] 4,269,654
[45] May 26, 1981

[54] SILICON NITRIDE AND SILICON OXIDE ETCHANT

[75] Inventors: Cheryl A. Deckert, Lawrenceville, N.J.; George L. Schnable, Lansdale, Pa.

[73] Assignee: RCA Corporation, New York, N.Y.

[21] Appl. No.: 37,378

[22] Filed: May 9, 1979

Related U.S. Application Data

[63] Continuation of Ser. No. 852,932, Nov. 18, 1977, abandoned.

[51] Int. Cl.³ .................. H01L 21/312; B44C 1/22; C03C 15/00; C03C 25/06
[52] U.S. Cl. ..................... 156/657; 156/659.1; 252/79.3; 252/79.4
[58] Field of Search ............... 134/2, 3; 252/79.3, 252/79.4; 156/653, 657, 662, 659.1

[56] References Cited

U.S. PATENT DOCUMENTS

| | | | |
|---|---|---|---|
| 3,518,135 | 6/1970 | Cerniglia et al. | 252/79.3 X |
| 3,607,480 | 9/1971 | Harrap | 252/79.3 X |
| 3,642,549 | 2/1972 | Couture et al. | 252/79.3 X |
| 3,709,749 | 1/1973 | Junzi sato et al. | 134/2 X |
| 3,811,974 | 5/1974 | Squillace et al. | 252/79.3 X |
| 3,979,241 | 9/1976 | Maeda et al. | 252/79.3 X |

OTHER PUBLICATIONS

Abstract No. 112, The Electrochemical Society Meeting, Spring 1977, pp. 300–302, Etching of CVD $Si_3N_4$ Films in Acidic Fluoride Media by Cheryl A. Deckert.
Semiconductor Silicon, The Electrochemical Society, Princeton, New Jersey, 1973, pp. 354–362, Equal Etch Rates of $Si_3N_4$ and $SiO_2$ Utilizing HF Dilution and Temperature Dependence by Victor Harrap.
Abstract No. 124, The Electrochemical Society Meeting of 1973 pp. 313–315, Equal Etch Rates of $Si_3N_4$ and $SiO_2$ Utilizing HF Dilution and Temperature Dependence by Victor Harrap, Spring Meeting.

*Primary Examiner*—William A. Powell
*Attorney, Agent, or Firm*—H. Christoffersen; B. E. Morris; H. F. VanDenburgh

[57] ABSTRACT

An etching solution for etching composite structures of silicon nitride on silicon oxide on silicon substrates which etches the silicon nitride at a rate equal to or faster than the silicon oxide which comprises concentrated aqueous hydrogen fluoride in a high boiling, organic solvent.

7 Claims, 5 Drawing Figures

SILICON NITRIDE AND SILICON OXIDE ETCHANT

This is a continuation of application Ser. No. 852,932, filed Nov. 18, 1977, now abandoned.

This invention relates to a method of etching silicon nitride-silicon oxide composite structures. More particularly, this invention relates to a method of etching such composite structures so that the silicon nitride is etched at a rate equal to or faster than the silicon oxide.

BACKGROUND OF THE INVENTION

In the fabrication of various silicon devices such as MNOS field effect transistor devices and the like, the silicon wafer substrate is variously doped to form p-type and n-type regions which are coated with double dielectric layers of silicon oxide, usually thermally grown, and silicon nitride. These regions are connected to each other and to other parts by means of contacts applied to the silicon surface. Thus openings must be formed through the silicon nitride and silicon oxide layers to expose the underlying silicon surface for deposition of the conductive metal contact. This is generally done using conventional photolithographic techniques whereby a layer of photoresist is applied, exposed to a suitably patterned mask and developed to form the desired openings through the photomask to the silicon nitride layer and underlying silicon oxide layer, which layers are then etched away in the opened areas. Optionally, a chemical vapor deposited (CVD) silica protective layer is applied over the silicon nitride layer and this layer also must be etched away.

Several etchants for silicon nitride and silicon oxide are known. Refluxing ortho-phosphoric acid is an excellent etch for silicon nitride, but it does not etch silicon oxide. Aqueous hydrogen fluoride etches both silicon nitride and silicon oxide, but etches silicon oxide much faster than silicon nitride. See Harrap, Semiconductor Silicon, The Electrochemical Society, Princeton, New Jersey (1973) pp. 354–359. Aqueous hydrogen fluoride buffered with ammonium fluoride is a rapid etch (1000 angstroms per minute) for silicon oxide, but etches silicon nitride only very slowly (about 15 angstroms per minute). Thus this etchant requires long processing times for the silicon nitride and also gives a geometry, e.g. undercuts, to the etched walls unfavorable for further processing such as metallization. In order to form slightly tapered walls which are narrower near the silicon substrate, the silicon nitride etch rate should be at least equal to and preferably faster than the silicon oxide etch rate. This configuration of the etched walls insures uniformity and complete metallization of the etched profile.

Thus in order to obtain the desired geometric configuration of the etched pattern, the solid state industry has used a three-step etch whereby the nitride is etched in hot phosphoric acid solution, the oxide is then etched in a separate hydrogen fluoride solution and the overhanging lip of silicon nitride produced during the oxide etch is removed in hot (180° C.) 85 percent phosphoric acid. Careful control of this process is required to avoid under or over etching and to avoid undercutting of the layers by the several etchants. Further, etching over half of the silicon nitride tends to adversely affect that layer's integrity. Certainly a single etchant solution would be preferred to lower the cost of manufacture.

Squillace et al, U.S. Pat. No. 3,811,974, discloses a phosphoric acid-fluoroboric acid mixture for etching silicon nitride-silicon oxide composite structures. By varying the temperature and the concentration of the fluoroboric acid, the relative etch rates may be adjusted. However, etching is slow, on the order of about 100 angstroms per minute, and in practice the rate of etching of the silicon nitride is generally slower than the rate of etching of the silicon oxide.

Thus a single etchant for a silicon nitride-silicon oxide composite structure which etches silicon nitride faster than silicon oxide to produce the desired tapered wall configuration of the etched areas, would be highly desirable.

SUMMARY OF THE INVENTION

We have found that an etchant solution comprising concentrated aqueous hydrogen fluoride in a high boiling organic solvent that is miscible with water and compatible with hydrogen fluoride can be employed at elevated temperatures to etch both silicon nitride and silicon oxide and to etch the silicon nitride at a rate at least equal to that of the silicon oxide, to produce the desired patterned structure.

DETAILED DESCRIPTION OF THE INVENTION

Figure 1A:
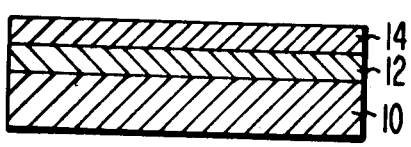
FIG. 1a is a cross-sectional view of a composite structure to be patterned according to the present process.

Referring to FIG. 1, the substrate 10 is a suitable substrate such as a silicon wafer which may be doped to have p-type or n-type regions. The substrate 10 is coated with a first layer of silicon oxide 12, such as silicon dioxide, which can be grown from the silicon wafer substrate 10 in conventional manner, as by passing steam and hydrochloric acid over the substrate 10 in a furnace at elevated temperatures until an oxide layer 12 of the desired thickness is formed. The oxide layer 12 in turn is coated with a silicon nitride layer 14. The silicon nitride layer 14 can be deposited by chemical vapor deposition, as by passing a mixture of silicon tetrachloride and ammonia, or silane and ammonia, at elevated temperatures over the oxide layer 12. Optionally an additional layer of chemical vapor deposited silicon oxide (not shown) can be applied over the silicon nitride layer as a protective coating.

Figure 1B:
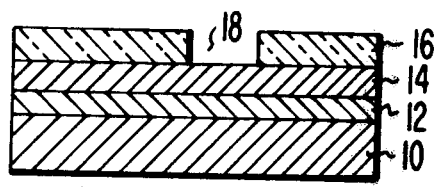
FIG. 1b is a cross-sectional view of a composite structure after masking.

FIG. 1b illustrates a masking layer 16 of photoresist applied using conventional lithographic techniques having an opening 18 in the masking layer 16, thereby exposing a portion of the silicon nitride layer 14. Other masks can also be employed to form a pattern, such as polycrystalline silicon or a metal such as molybdenum, platinum or tungsten.

Figure 1C:
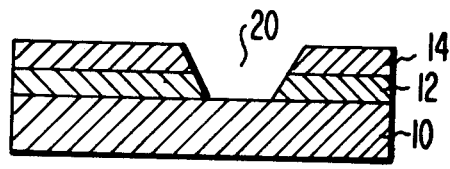
FIG. 1c is a cross-sectional view of a composite structure after patterning according to the present process.

The masked composite structure shown in FIG. 1b is immersed in a heated mixture of aqueous hydrogen fluoride in a suitable organic solvent until the silicon substrate 10 is exposed and the photoresist removed with a solvent, as shown in FIG. 1c. Since the etching rate of the silicon nitride layer 14 is equal to or faster than the etching rate of the silicon oxide layer 12, the walls of the opening 20 have a tapered configuration which is preferred for the subsequent deposition of metal to form a contact in a device.

The surprising result obtained herein is that the presence of the organic solvent decreases the etch rate of the silicon oxide to a far greater extent than the etch rate of the silicon nitride, so that their relative rates of dissolution are reversed from that of hydrogen fluoride in aqueous solution. This result allows the formation of sloped wall openings to composite layers of silicon nitride and silicon oxide on silicon using a single etching solution.

The etching solution described herein is made by admixing concentrated aqueous hydrogen fluoride with an organic solvent that has a relatively high boiling point, i.e., at least about 80° C., is miscible with water, and is compatible with the hydrogen fluoride and water.

Organic solvents suitable for use herein include glycerol, ethers such as ethylene glycol monoethyl ether, ethylene glycol, and the like.

The concentration of the etchant solution is not critical, but in general a more concentrated solution provides a faster etch rate for both silicon oxide and silicon nitride.

The temperature of the etchant solution during etching is preferably between about 80° C. and about 115° C. Aqueous hydrogen fluoride boils at about 120° C., thus providing an effective upper temperature limit for convenient operation. Further, conventional photoresist may begin to degrade above about 110° C.; thus when a photoresist is employed as the patterning layer, operation below the degradation temperature of the photoresist masking layer may also be desirable. At temperatures below about 75° C., the rate of etching of silicon oxide and silicon nitride becomes very slow. Thus, higher temperatures will be employed when a tapered wall configuration is desired.

The absolute etch rate of the silicon nitride and silicon oxide layers can be varied by varying the temperature of the etchant solution and the concentration of hydrogen fluoride. The relative etch rate between silicon oxide and silicon nitride can be varied by varying the temperature, the etch rate of silicon nitride decreasing more rapidly at temperatures at least between about 80°–100° C. than the etch rate of thermally grown silicon oxide.

The resultant patterned composite structure can be metallized and processed to form conventional metal-nitride-oxide-silicon (MNOS) devices.

The invention will be further illustrated by the following Examples but the invention is not meant to be limited to the details described therein.

EXAMPLE 1

A layer of silicon oxide about 500 angstroms thick was thermally grown on a silicon wafer by passing steam and hydrogen chloride at a temperature of about 875° C. over the wafer in conventional manner.

A layer of silicon nitride was then deposited over another silicon wafer by chemical vapor deposition. The latter wafer was heated in a furnace at about 875° C. while passing a mixture of 0.21 gram per minute of silicon tetrachloride and 600 cm³ per minute of ammonia in a carrier gas stream of nitrogen at a flow rate of 225 liters per minute. The molar ratio of ammonia to silicon tetrachloride was about 21. The deposition rate of silicon nitride under these conditions is about 120–130 angstroms per minute.

An etchant solution was prepared by adding 34 milliliters (ml) of concentrated (49 percent by weight) aqueous hydrogen fluoride (HF) to glycerol to make 1 liter. This solution is about 1 molar in HF.

Several oxide coated wafers and nitride coated wafers, prepared as above, were immersed in the etchant solution at varying temperatures and the etch rates measured. The data are summarized below in Table 1.

TABLE 1

| Temperature, °C. | Etch Rate, Angstroms/min. | |
|---|---|---|
| | Silicon Nitride | Silicon Oxide |
| 110 | 180 | 70 |
| 96 | 120 | 36 |
| 82 | 47 | 20 |

As a comparison, similar coated wafers were immersed in 1 molar aqueous hydrogen fluoride solution. The data is summarized below in Table 2.

TABLE 2

| Temperature, °C. | Etch Rate, Angstroms/min. | |
|---|---|---|
| | Silicon Nitride | Silicon Oxide |
| 96 | 440 | 2000 |
| 82 | 220 | 1100 |

EXAMPLE 2

A series of silicon wafers were coated with a thermally grown layer of silicon oxide about 500 angstroms thick as in Example 1 and with a layer of silicon nitride about 1000 angstroms thick. The silicon nitride was applied by chemical vapor deposition at about 750° C. by passing a gas mixture over the wafer composed of 0.55 liter per minute of silane, 3.14 liters per minute of ammonia and 40 liters per minute of nitrogen carrier gas. The molar ratio of ammonia to silane was about 6.

The wafers were then coated with a final layer of silica about 7000 angstroms thick applied in conventional manner by chemical vapor deposition using silane and oxygen in a nitrogen carrier gas at 400° C.

Figure 2:
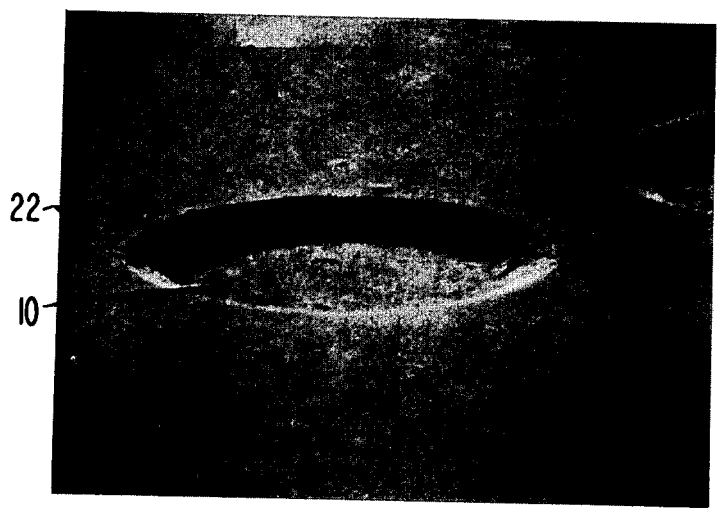
FIGS. 2 and 3 are photomicrographs of structures after patterning according to the present process.

The wafers were coated with a layer of positive photoresist, AZ 1350B of the Shipley Co., exposed through a mask and developed to expose portions of the chemical vapor deposited silica layer. The wafers were then immersed in the etchant solution of Example 1 at about 80°–82° C. for about 85 minutes to etch through to the silicon wafer 10. The photoresist was then removed in conventional manner. The photomicrograph of FIG. 2 shows the sloped walls obtained, indicating that the chemical vapor deposited silica 22 and silicon nitride 14 etched faster than the thermally grown silicon oxide layer 12.

EXAMPLE 3

A silicon wafer was coated with a layer of thermally grown silicon dioxide about 500 angstroms thick as in Example 1 and a layer of silicon nitride about 500 angstroms thick as in Example 2.

A layer of AZ 1350B photoresist was applied, exposed through a mask and developed to expose the silicon nitride layer. The wafers were immersed in the etchant solution of Example 1 for about 30 minutes at 80° C., and the resist removed.

Figure 3:
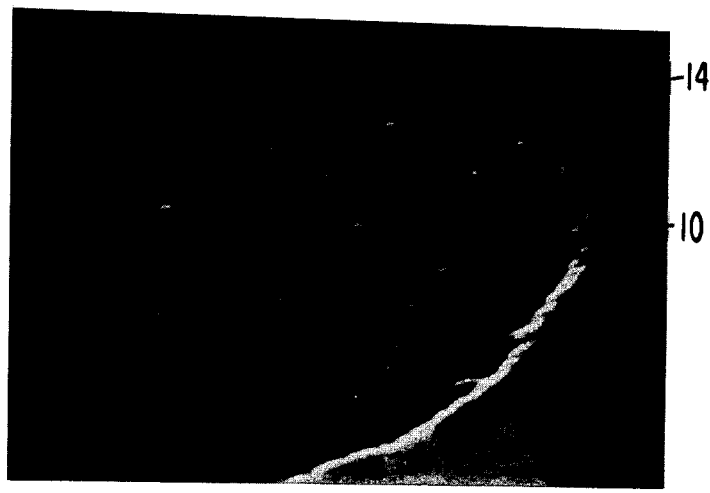

The photomicrograph of FIG. 3 clearly shows the sloped walls obtained, indicating that the silicon nitride 14 etched at an equal or faster rate than the silicon oxide layer, exposing the underlying silicon wafer 10.

EXAMPLE 4

An etchant solution was prepared as in Example 1 except that 100 ml of the hydrogen fluoride solution was added to glycerol.

A silicon wafer coated with a first layer of thermally grown silicon dioxide as in Example 1 about 500 angstroms thick, a second layer of silicon nitride about 1000 angstroms thick and a third layer of silica as in Example 2 about 7000 angstroms thick was in turn coated with AZ 1350 photoresist, exposed through a mask and developed as in Example 2. The wafer was immersed in the above etchant solution at about 80°–82° C. for 17 minutes to etch through to the silicon, and the remaining photoresist removed.

Sloped walls were obtained, indicating that the silica and silicon nitride layers etched faster than the thermally grown silicon oxide layer.

EXAMPLE 5

Silicon wafers were coated with a thermally grown silicon oxide layer as in Example 1 and other silicon wafers were coated with silicon nitride layers, also prepared as in Example 1.

An etchant solution was prepared by adding 68 ml of concentrated aqueous HF to ethylene glycol to make one liter. This solution is about 2 molar (M) in HF.

The etch rates were measured at 80° C. and compared to similar wafers etched in 2 M aqueous HF, also at 80° C. The data is summarized below in Table 3.

TABLE 3

| Etchant Solvent | Etch Rate, Angstroms/min. | |
|---|---|---|
| | Silicon Nitride | Silicon Oxide |
| ethylene glycol | 120 | 49 |
| water | 650 | 2900 |

We claim:

1. An etchant solution for the concurrent etching of both silicon oxide and silicon nitride layers that etches silicon nitride at a rate faster than silicon oxide to produce openings in said layers having a tapered wall configuration which comprises concentrated aqueous hydrogen fluoride in a high boiling organic solvent, that is miscible with water and compatible with hydrogen fluoride, and which is maintained at a temperature of between about 80° C. and about 120° C.

2. An etchant solution according to claim 1 wherein said organic solvent is glycerol.

3. An etchant solution according to claim 1 wherein said organic solvent is ethylene glycol.

4. An etchant solution as in claim 1 wherein the concentration of hydrogen fluoride is from about 1–3 molar.

5. A method of etching composite structures of silicon nitride on silicon oxide on a silicon substrate that etches the silicon nitride at a rate faster than the silicon oxide to produce openings having a tapered wall configuration which comprises immersing the structure in an etchant solution of concentrated aqueous hydrogen fluoride in a high boiling organic solvent that is miscible with water and compatible with hydrogen fluoride at a temperature of at least about 80° C. for a time sufficient to etch through to the silicon substrate.

6. A method of etching composite structures of silica on silicon nitride on silicon oxide on a silicon substrate that etches the silicon nitride at a rate faster than the silicon oxide to produce openings having a tapered wall configuration which comprises immersing the structure in an etchant solution of concentrated aqueous hydrogen fluoride in a high boiling organic solvent that is miscible with water and compatible with hydrogen fluoride at a temperature of at least about 80° C. for a time sufficient to etch through to the silicon substrate.

7. An etchant solution for the concurrent etching of both silicon oxide and silicon nitride layers that etches silicon nitride at a rate faster than silicon oxide to produce openings in said layers having a tapered wall configuration which consists essentially of concentrated aqueous hydrogen fluoride in a high boiling organic solvent that is miscible with water and compatible with hydrogen fluoride.

* * * * *